(12) United States Patent
James-Roxby et al.

(10) Patent No.: US 7,131,077 B1
(45) Date of Patent: Oct. 31, 2006

(54) USING AN EMBEDDED PROCESSOR TO IMPLEMENT A FINITE STATE MACHINE

(75) Inventors: Philip B. James-Roxby, Longmont, CO (US); Eric R. Keller, Boulder, CO (US)

(73) Assignee: Xilinx, INC, San Jose, CA (US)

( * ) Notice: Subject to any disclaimer, the term of this patent is extended or adjusted under 35 U.S.C. 154(b) by 443 days.

(21) Appl. No.: 10/402,659

(22) Filed: Mar. 28, 2003

(51) Int. Cl.
*G06F 17/50* (2006.01)

(52) U.S. Cl. ............................................. 716/3; 716/18

(58) Field of Classification Search ................... 716/1, 716/3, 17, 18; 703/13–22
See application file for complete search history.

(56) References Cited

U.S. PATENT DOCUMENTS

| | | | | |
|---|---|---|---|---|
| 5,280,595 | A | * | 1/1994 | Lemay et al. ............... 711/220 |
| 5,892,900 | A | * | 4/1999 | Ginter et al. .................. 726/26 |
| 6,618,839 | B1 | * | 9/2003 | Beardslee et al. ............. 716/4 |
| 6,904,577 | B1 | * | 6/2005 | Schubert et al. ............... 716/4 |
| 6,931,572 | B1 | * | 8/2005 | Schubert et al. .............. 714/34 |
| 7,007,264 | B1 | | 2/2006 | Baxter |
| 2002/0161907 | A1 | * | 10/2002 | Moon ......................... 709/230 |

OTHER PUBLICATIONS

Chen et al., A Model Driven XML Tramsformation Framework for Bussiness Performance Management, 2005, IEEE.*
Eric Keller et al.; "Software Decelerators"; 13th International Field Programmable Logic and Applications Conference (FPL); Sep. 1-3, 2003; Lecture Notes In Computer Science 2778; pp. 1-10.
IBM Microelectronics: "CoreConnect Bus Architecture-A32-,64-, 128-bit core on-chip bus standard"; available from IBM at http://www.chips.ibm.com; Copyright International Business Machines Corporation 1999; pp. 1-2.
IBM; "The CoreConnect Bus Architecture"; available from IBM; Copyright International Business Machines Corporation, 1999; pp. 1-8.

* cited by examiner

*Primary Examiner*—Paul Dinh
*Assistant Examiner*—Nghia M. Doan
(74) *Attorney, Agent, or Firm*—Kim Kanzaki

(57) ABSTRACT

Method and System for implementing a Finite State Machine (FSM) using software executed on a processor and having accurate timing information is described, where the accurate timing information is determined without the need to execute the software. An exemplary embodiment includes an IC having an embedded processor and a programmable logic fabric, where part or all of an FSM is implemented using assembly language code stored in a memory, for example, a cache memory, of the embedded processor.

18 Claims, 13 Drawing Sheets

```
STATE_000001:
  # Check Clock
  lwz 20, 0(4)    # load previous clock value from mem takes 1 cycle
  mfdcr 21, 0     # load current clock value from DCR takes 9 cycles
  stw 21, 0(4)    # storing the current clock value (so it will be the previous
                  # clock value the next time you check) takes 1 cycle
  li 22, 1        # load the value 1 into reg 22 takes 1 cycle
  slw 21, 21, 22  # shift left register 21 by the amount in reg 22 (which is 1) and
                  # store the result in reg 21. This takes 1 cycle
  or 20, 20, 21   # or registers 20 and 21 and store result in 20 takes 1 cycle
  cmpi 0, 0, 20, 2 # compare register 20 to the value 2. takes 1 cycle
  bne- STATE_000001 # Branch if not equal (ie reg 20 is not 2) to STATE_000001.
                  # If it does branch, then it takes 3 cycles, if it does not then
                  # it takes 1 cycle.
                  # so CLOCK [BRANCH] is 18 cycles STATE_000001_AC: # total up to this point is 16 cycles => CLOCK [NOT BRANCH]
  # Check Reset
  mfdcr 5, 1      # load reset signal from DCR into register 5, takes 9 cycles
  cmpi 0,0,5, 1   # compare register 5 with 1, takes 1 cycle
  beq- STATE_RST_AC # if it was a 1 then branch to STATE_RST_AC (AC stands for
                  # after clock since the clock edge was already detected).
                  # If branch is taken, it takes 3 cycles, if not it takes 1.
                  # RESET to STATE_RST is 29 (16 + 9 + 1 + 3)
  # cnt = cnt+1   # total up to this point is 27
  lwz 24, 0x3c(4) # load cnt from memory, 1 cycle
  addi 5, 24, 0x1 # add 1 to it, 1 cycle
  stw 5, 0x3c(4)  # store back in memory, 1 cycle
  # ready = 0
  li 23, 0        # 1 cycle
  mtdcr 0x3, 0    # 9 cycles
  # mdio_tristate = 0
  li 20, 0        # 1 cycle
  mtdcr 0x1, 0    # 9 cycles
  # if (cnt==b100000) then goto STATE_100000
  lwz 24, 0x3c(4) # load cnt from mem, 1 cycle
  cmpi 0, 0, 24, 0x20 # compare to 0x20, 1 cycle
  mfcr 5          # move field 5 from the condition register (CR), 1 cycle
  srawi 5, 5, 2   # shift right 2 bits, this is the bit that's set if the
                  # condition was true, 1 cycle
  andi. 5, 5, 1   # mask out all bits other than the first bit, 1 cycle
  cmpi 0,0,5, 0x0 # compare that bit to 0 (if it is 0 then cnt was not equal
                  # to b100000), 1 cycle
  bne- STATE_100000 # if not equal then go to STATE_100000 (meaning cnt was equal)
                  # 3 cycles to take branch, 1 to not take branch. So total to
                  # STATE_100000 is 59.
  # else goto STATE_000001
  b STATE_000001  # branch to STATE_00001, takes 1 cycle. So total to
                  # STATE_000001 is 58.
```

FIG. 9

Timing Report For miim
Processor Clock Period is: 2.857143 ns
Bus Type is: DCR

STATE_RST
  CLOCK [branch => 18 cycles (51.428574 ns ) - 9 cycles IO]
      [not branch =>16 cycles (45.714287 ns ) - 9 cycles IO]
  to STATE_000000 : 73 cycles ( 208.57143 ns ) - 27 IO cycles
  to STATE_RST : 72 cycles ( 205.7143 ns ) - 27 IO cycles
STATE_000000
  CLOCK [branch => 18 cycles (51.428574 ns ) - 9 cycles IO]
      [not branch =>16 cycles (45.714287 ns ) - 9 cycles IO]
  RESET to STATE_RST : 29 cycles ( 71.42857 ns ) - 18 IO cycles
  to STATE_000001 : 51 cycles ( 145.7143 ns ) - 18 IO cycles
STATE_000001
  CLOCK [branch => 18 cycles (51.428574 ns ) - 9 cycles IO]
      [not branch =>16 cycles (45.714287 ns ) - 9 cycles IO]
  RESET to STATE_RST : 29 cycles ( 71.42857 ns ) - 18 IO cycles
  to STATE_100000 : 59 cycles ( 168.57143 ns ) - 18 IO cycles
  to STATE_000001 : 58 cycles ( 165.7143 ns ) - 18 IO cycles
STATE_100000
  CLOCK [branch => 18 cycles (51.428574 ns ) - 9 cycles IO]
      [not branch =>16 cycles (45.714287 ns ) - 9 cycles IO]
  RESET to STATE_RST : 29 cycles ( 71.42857 ns ) - 18 IO cycles
  to STATE_100001 : 61 cycles ( 174.28572 ns ) - 18 IO cycles
STATE_100001
  CLOCK [branch => 18 cycles (51.428574 ns ) - 9 cycles IO]
      [not branch =>16 cycles (45.714287 ns ) - 9 cycles IO]
  RESET to STATE_RST : 29 cycles ( 71.42857 ns ) - 18 IO cycles
  to STATE_100010 : 58 cycles ( 165.7143 ns ) - 18 IO cycle

USING AN EMBEDDED PROCESSOR TO IMPLEMENT A FINITE STATE MACHINE

REFERENCE TO A COMPUTER PROGRAM LISTING APPENDIX

This application includes a computer program-listing appendix on a single compact disc, the contents of which are incorporated herein by reference. The compact disc contains a first 3 KB file entitled "commented_miim_dcr.txt", a second 9 KB file entitled "miim_dcr_asm.txt", a third 3 KB file entitled "miim_dcr_gpio_vhd.txt", a fourth 15 KB file entitled "miim_manual_vhd.txt", a fifth 9 KB file entitled "miim_plb_asm.txt", a sixth 8 KB file entitled "miim_xml.txt", a seventh 4 KB file entitled "report_miim_dcr.txt", and an eight 4 KB file entitled "report_miim_plb.txt" all of which were created on Mar. 26, 2003. A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

One or more aspects of the invention generally relate to finite state machine(FSM) design, and more particularly to implementing an FSM or a part thereof using software executed by a processor.

BACKGROUND OF THE INVENTION

Integrated circuits (ICs) having programmable logic, for example, field programmable gate arrays (FPGAs), are popular hardware devices for quickly implementing circuit designs. An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data into internal configuration memory cells that define how the CLBs, IOBs, and interconnect structure are configured. The configuration data may be read from an external memory, conventionally an external integrated circuit memory EEPROM, EPROM, PROM, and the like.

In order to improve the usefulness of the FPGA, a processor core, such as the PowerPC® processor of IBM Corp. of Armonk, N.Y., was embedded in an FPGA, for example, the Virtex-II™ Pro FPGA from Xilinx, Inc. of San Jose, Calif.

FIG. 1 illustrates a generic prior art diagram of an FPGA having an embedded processor. The FPGA 10 includes a programmable logic fabric 14 having the CLBs and interconnect structure, and an I/O ring 16 having the IOBs. The IOBs are fabricated on a substrate supporting the FPGA 10 and are coupled to the pins of the integrated circuit, allowing users access to the programmable logic fabric 14 and the processor core 12. The processor core 12, includes a central processing unit (CPU) 8 connected to one or more cache memories 9.

FIG. 2 is conventional bus architecture for an FPGA 10 having the processor core 12. An example is IBM's CoreConnect™ Bus Architecture. Most of the components and buses shown in FIG. 2 are implemented in the programmable logic fabric 14 of FIG. 1. The processor core 12 communicates with the On-Chip Memory (OCM) 110, via an On-Chip Memory (OCM) bus 112. The OCM 110 includes one or more of the FPGA's Block Random Access Memory (BRAM) modules (not shown). There are three major buses, i.e., bus 114, bus 115, and bus 116 that allow processor core 12 to communicate with other components or devices. A bus may have a bus arbiter, which controls access to the bus, e.g., PLB ARB 122 for bus 114 and OPB ARB 127 for bus 116.

Bus 114, also called a processor local bus (PLB) 114, connects processor core 12 to high-speed devices/components 120. These high-speed devices/components 120 could include memory, FSMS, and other high performance peripherals. A device/component that takes control of PLB 114 to handle its own transfer is called a "master", whereas a device/component that receives commands from the master to send data is called a "slave".

Bus 116, also called an on-chip peripheral bus (OPB) 116, provides processor core 12 access to low speed devices/components 125. These low speed devices/components 125 could include UARTs and Ethernet connections. Note that low speed devices/components 125, like high speed devices/components 120, can include both masters and slaves. However, to prevent these low speed devices/components 125 from affecting the performance of processor core 12, OPB 116 is not connected directly to processor core 12. Instead, OPB 116 is coupled to PLB 114 via an OPB bridge 118. OPB bridge 118 can automatically convert data formats and protocols, thereby facilitating the transfer of information between OPB 116 and PLB 122.

Bus 115, also called a Device Control Register (DCR) bus 115, allows the processor core 12 relatively low speed communications in order to manage status and configuration registers, e.g., Device Control Registers, on the other devices/components. DCR bus 115 connects, via a daisy chain arrangement, the processor core 12 (master) to the OCM 110 (slave), high-speed devices/components 120 (slaves), and low-speed devices/components 125 (slaves).

A conventional component implemented in an FPGA without an embedded processor is an FSM. Particular FSMs may contain a large number of states, and may involve much computation to determine the next state and the state outputs based on varying inputs. However, these FSMs may actually have relatively relaxed timing constraints compared to the rest of the system, e.g., the other components implemented in the programmable logic fabric, which suggests that the FSM may be implemented in software rather than in hardware. Hence for an FPGA with an embedded processor, having the processor implement part or all of the FSM would free up the associated programmable logic fabric resources.

An example of implementing an FSM in hardware and software is the Berkeley POLIS system. POLIS is a complete co-design solution, which uses the co-design finite state machine (CFSM) as the central representation of the required system behavior. The single CFSM can be partitioned into multiple software or hardware sub-networks. A hardware CFSM sub-network is constructed using standard logic synthesis techniques, and can execute a transition in a single clock cycle.

A software CFSM sub-network is transformed into a software program and a simple custom real time operating system. The program is generated from a control/data flow graph, and is coded in C. In order to get accurate timing information, such as the time duration for each state and each state transition, the C code must be instrumented and the code executed on the processor. The instrumented version counts the actual processor cycles used, hence giving an accurate way of extracting timing information.

The interfaces between the hardware and software sub-networks are automatically synthesized in POLIS and come in the form of cooperating circuits and software procedures (I/O drivers) embedded in the synthesized implementation. Communication to the I/O drivers can be through specific I/O ports available on the processor, or via general memory mapped I/O.

One of the significant disadvantages of the CFSM approach is that the code must be instrumented (each line of C code has appended to it instructions to count clock cycles associated with executing the line of code), and the code must actually be executed before accurate timing data is known. It would be much more efficient if timing data could be determined from an examination of the code, before execution of the code.

Another disadvantage of the CFSM approach is that, although the CFSM at the top level has a uniform view of the FSM, at the lower implementation level, a hardware FSM looks significantly different than a software FSM. Hence the interface between the software part of and the hardware part of a single FSM and generally, the interface between a software FSM and the hardware components, for example, the hardware implemented in an FPGA, is relatively complicated. It would be desirable, if the interface between the hardware logic circuitry and the processor consume minimal resources and be designed to shield the hardware logic circuitry from the processor and vice versa.

Accordingly, there is a need for better techniques to design and implement an FSM using software executed on a processor and having accurate timing information.

SUMMARY OF THE INVENTION

The present invention includes a method and a system for implementing an FSM, or part thereof, using software executed on a processor and having accurate timing information, where the accurate timing information is determined without the need to execute the software. An exemplary embodiment of the present invention includes an IC having an embedded processor and a programmable logic fabric, where part or all of an FSM is implemented using assembly language code stored in a memory, for example, a cache memory, of the embedded processor.

In a preferred embodiment of the present invention, a textual or graphical (or both) interface is used to design the FSM such that the implementation of the FSM by assembly language instructions executed by the embedded processor or by logic in the programmable logic fabric or both is transparent to the user. Accurate timing information for the FSM, or part thereof, stored in a cache memory of the embedded processor, is determined by counting embedded processor clock cycles associated with each assembly language instruction, where such determination is done without the need to instrument or execute the assembly language code. In addition part of or all of the FSM implemented using the embedded processor is encapsulated such that other hardware components implemented in the programmable logic fabric see the embedded processor as a black box. A further aspect includes the selection of the target bus, e.g., the PLB, DCR bus, or OCM bus, to be used when creating the FSM, or part thereof, associated with the embedded processor.

An embodiment of the present invention includes a method for implementing an FSM using a processor. First a description of a plurality of states of the FSM is obtained.

Next, instructions for a state are generated from the description, where the instructions are stored in a computer readable medium accessible by the processor. Each instruction has a pre-determined number of processor clock cycles associated with that instruction. Lastly, before execution of the plurality of instructions on the processor, timing information for the state is generated based on an accumulation of the pre-determined number of processor clock cycles associated with each instruction.

Another embodiment of the present invention includes a system for generating an FSM or part thereof for use by a processor embedded in an integrated circuit having a programmable logic fabric. The system includes: a textual description of the FSM or part thereof, wherein the textual description is written in an eXtensible Mark-up Language (XML); translation code stored in a computer readable medium, configured to convert the textual description to a plurality of assembly language instructions; a cache memory coupled to the processor, where the cache memory is for storing the assembly language instructions; a predetermined number of processor clock cycles associated with each assembly language instruction; and a timing output having an indication of a duration of time in a state of the FSM, where the state includes the assembly language instructions, and where the indication is derived at least in part from the predetermined numbers.

The system may further include, an interface for hiding the implementation of the FSM or part thereof on the processor from the programmable logic fabric, where the interface is configured to convert inputs to the FSM or part thereof into data bus inputs into the processor and data bus outputs of the processor to outputs of the FSM or part thereof.

Yet another embodiment of the present invention includes a system for generating timing information for an FSM or part thereof executed by a processor. The system includes: instructions stored in a computer readable medium, where the instructions define at least part of a state of the FSM or part thereof; a count of processor clock cycles associated with an instruction, where the count is determined before the instruction is executed; and timing information for the state comprising a total count of processor clock cycles associated with the instructions.

These and other embodiments of the present invention are described in more detail in conjunction with the text below and attached figures.

BRIEF DESCRIPTION OF THE DRAWINGS

FIG. 9 is a commented example of the assembly language code that is generated from the XML description;

FIG. 10 is an example timing report of an aspect of the present invention;

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention.

In the preferred embodiment of the present invention an FSM is implemented in whole or part in assembly language code that is run on a processor core 12 (FIG. 1) of FPGA 10. The all or part of the FSM implemented using the processor core 12, is hereinafter referred to as the software FSM in order to simplify the explanation. The software FSM is encapsulated such that it appears as another hardware component when interfacing with the other hardware components in the programmable logic fabric 14, which may or may not include, other parts of the FSM implemented in the hardware. Hence the hardware components in the programmable logic fabric is shielded from the processor and vice versa.

Figure 2:
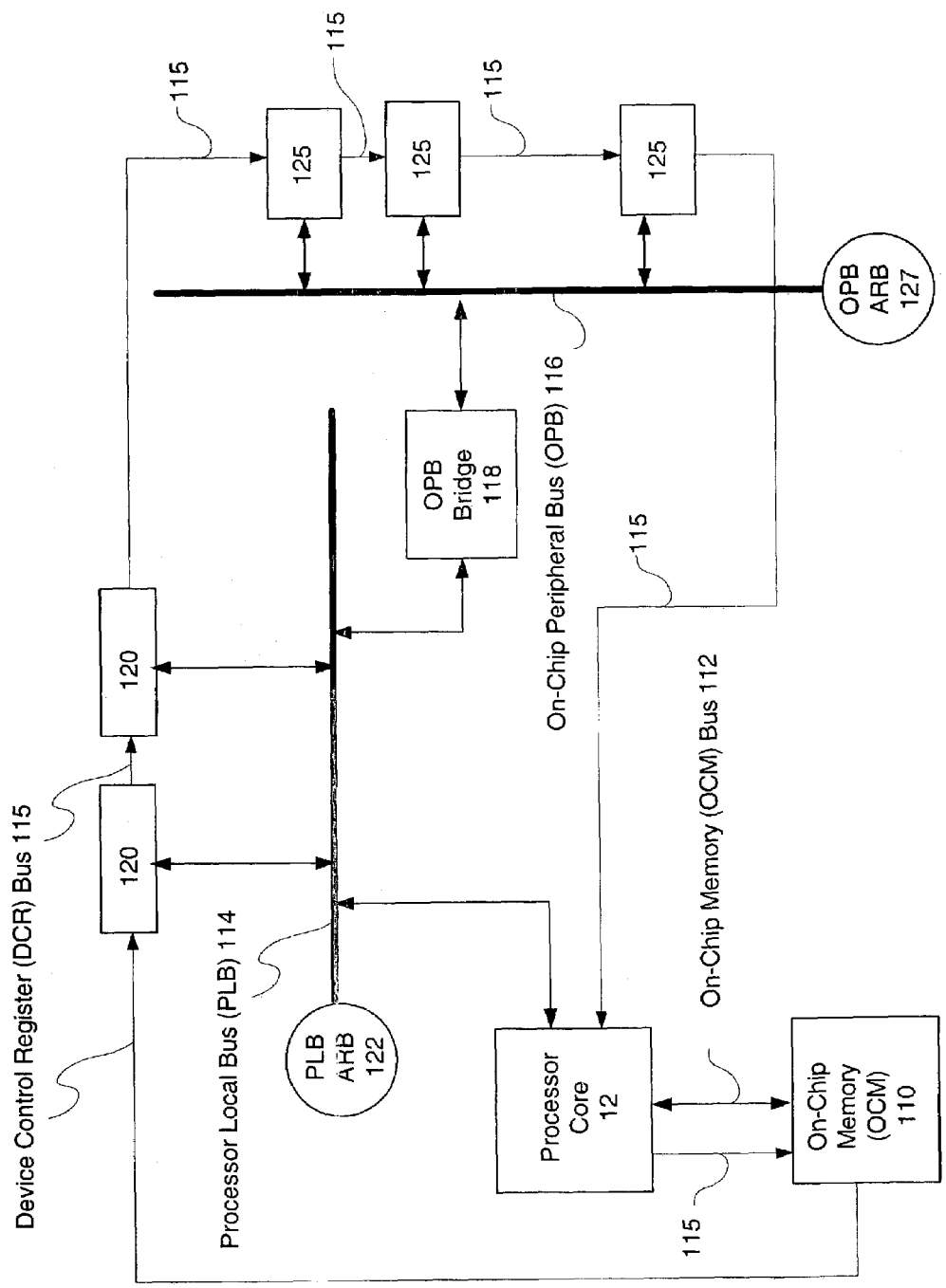
FIG. 2 is an example of a conventional bus architecture for an FPGA having an embedded processor core.

In the preferred embodiment, the interfacing logic that provides the encapsulation of the software FSM is simple, comprising a multiplexer (MUX), de-multiplexer (DE-MUX), and one of the buses in FIG. 2, i.e., PLB 114, DCR bus 115 or OCM bus 112. The interfacing logic is implemented using part of the programmable logic fabric 14. Data and a clock, e.g., an FSM clock (or alternatively, the fabric hardware (H/W) clock), is input to the interface from the other components in the programmable logic fabric 14 and data is outputted by the interface to the other components in the programmable logic fabric 14.

Also in the preferred embodiment the assembly language code is stored in cache 9 so that each line of code has associated with it the number of processor clock cycles to execute the line of code. The cache being fast and having totally deterministic access and retrieval times allows the accumulated count of the processor clock cycles for the assembly language lines of code in a particular FSM state to be used in generating accurate timing information for that particular FSM state. Specifically, an accurate estimate of the time duration in that particular FSM state is a function of the accumulated count, the processor clock period, and the FSM clock.

In other embodiments, another memory other than cache 9 is used to store the software code which may be in a language other than assembly, such as machine language, where the only requirement is that each line of code can be associated with a deterministic number of processor cycles to execute that line of code, before actual execution of the code.

Figure 3:
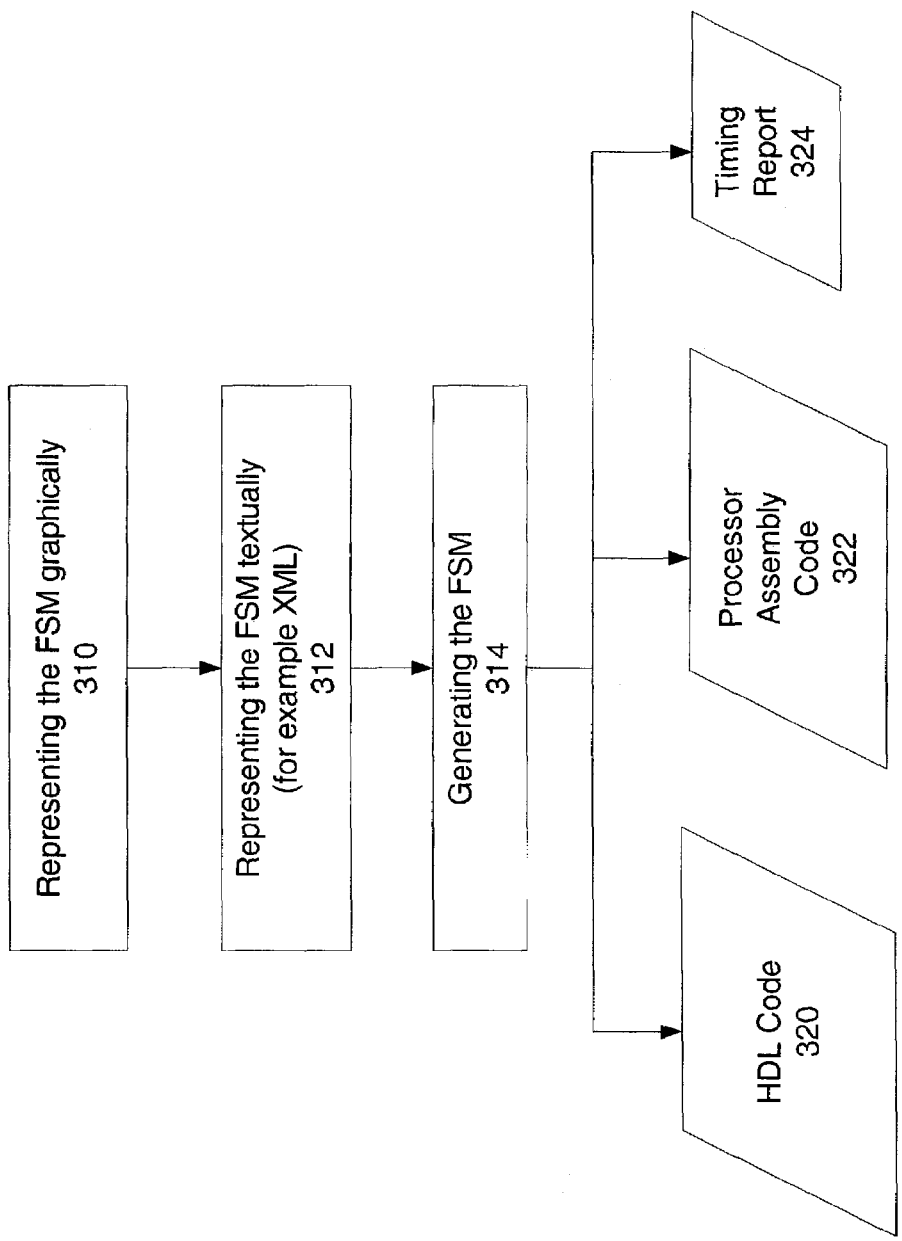
FIG. 3 is a flowchart for generating an FSM of an embodiment of the present invention.

FIG. 3 is a flowchart for generating an FSM of an embodiment of the present invention. At step 310 the FSM is, optionally, represented graphically, using, for example, StateCAD from Xilinx, StateFlow from Simulink, Esterel Studio from Esterel. In one embodiment this graphical representation is converted into a textual description (step 312). In the preferred embodiment an eXtended Markup Language (XML) description is created for the FSM. Some of the benefits of XML are that there are numerous parsers and validation of the structure is automatic in the parsing process. At step 314 a generating program is used to produce Hardware Description Language (HDL) code 320 such as VHDL or Verilog, assembly language code 322, and/or a timing report 324 for the FSM.

The XML file includes the inputs to, outputs from, and states of the software FSM. An example of the XML input and output variables is given in given in Table 1.

TABLE 1

```
<variables>
    <variable name="rst" type="in" width="1" registered = "true" />
    <variable name="clk" type="out" width="1" registered = "true" />
    <variable name="in1" type="in" width="16" registered = "true" />
    <variable name="in2" type="in" width="16"
```

Next the XML file specifies the states, starting with an initial XML statement (e.g., Table 2) specifying the global conditions for the state machine, such as reset input, clock input, reset state, and whether it is a synchronous or asynchronous reset.

TABLE 2

```
<states reset="sync" start="state0" rstvar="rst" clkvar="clk">
```

Following the initial XML statement are the statements for the individual software FSM states. Each state has zero or more equations and zero or more transitions associated with it. Each equation assigns a value to a left-hand side (lhs) which includes an output of the state (which may be used, in some instances, as input into another state). Inputs, constants, and operators (for example, add, sub, nand and nor) are used to form the right hand side (rhs) of the equation.

Transitions include the next state and the condition when the transition occurs. If no condition is given then the default is to loop back to the beginning of the present state. Equations can also be associated with transitions. A pseudo-code example of the relationship between transition condition and equation is:

```
If (condition 1) {
    output0 = calculate_some_value1( );
    goto state 1;
}
else if (condition 2) {
    output0 = calculate_some_value2( )
    goto state 2;
}
```

An example of XML statements for a state is given in Table 3, where the inputs to state0 are in1 and in2.

TABLE 3

```
<state name = "state0">
    <equations>
        <equation lhs="out0" rhs="in1 + in2" />
    </equations>
```

TABLE 3-continued

```
<transitions>
    <transition condition="in1 & in2" next="state1">
        <equations>
            <equation lhs = "ready" rhs="1" />
        <1 equations>
    </transition>
</transitions>
</state>
```

The XML is translated to assembly level code to be executed, for example, on a PowerPC™ PPC405 processor core from IBM Corporation. The assembly language code for each state has the following format:

```
// check clock (loop until rising clock edge)
// check for reset (branch to reset state if reset =
   '1')
// evaluate each equation
// calculate condition for transition 1
// branch if condition true
// calculate condition for transition 2
// branch if condition true
// . . .
```

The register assignment for each equation is done through a stack like method. The infix notation (i.e., typical representation) of an equation is transformed to a postfix notation. To evaluate the postfix equation the operands are placed on the stack and popped when an operator is encountered. The result is then pushed back on the stack. When a known number of available registers is used, the registers can be statically assigned, and the intermediate equation values can remain in the registers rather than be retrieved from memory. The location in the stack relates to the register being used. Input and output variables to the equation have a separate set of registers in order to maximize usage between equations.

Figure 4:
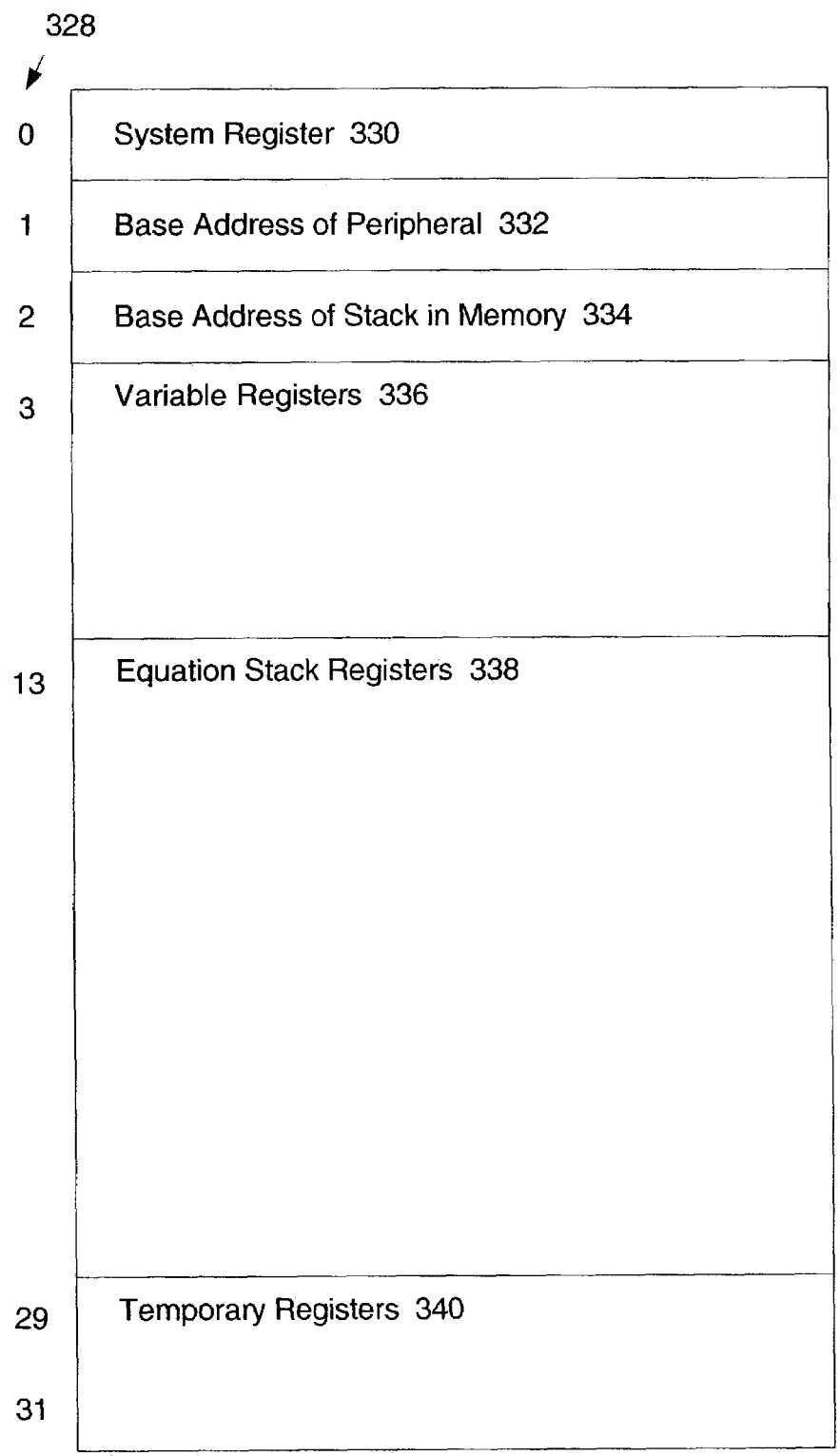
FIG. 4 is a representation of 32 registers in a processor core in an aspect of the present invention.

FIG. 4 is a representation of 32 registers in a processor core in an aspect of the present invention. The left-hand column 328 gives the register number (0 to 31). The system register 330 is at register 0. The base address of the peripherals 332 is in register 1. The base address of the stack in memory 334 is in register 2. The registers 3–12 are variable registers 336, which contain the input variables to the equation. Equation stack registers 338, i.e., registers 13 to 28, contain the intermediate (and final) results 338 when calculating the postfix equation. There are also temporary registers 340.

In order to understand how an equation from the XML file is converted to assembly language code, the following illustrative example is used:

Example: (in1+in2)−(in3+in4)−in5

Transformed to Postfix: in1 in2+in3 in4+−in5−

The following steps are performed with reference to FIG. 4:

1. Push in1 onto stack in memory using the base address of the stack 334 (stack contains in1). Since in1 is a variable, it has to be loaded into a register. Generate assembly code to load in1 into register 3.

2. Push in2 onto stack in memory (stack contains in2, in1). Since in2 is a variable, it has to be loaded into a register. Generate assembly code to load in1 into register 4.

3. '+' is encountered. Pop 2 values off of the stack. The stack operations are all at compile time. Since it is known which registers in1 and in2 will be loaded into (e.g., registers 3 and 4, respectively), output assembly code to perform an add operation on registers 3 and 4. Put the result in the first register allotted to the equation stack 338, e.g., register 13. Push the register number on the stack in memory—this is a static calculation and is performed at compile time and not runtime.

4. Push in3 on the stack (stack contains in3, reg13). Since in3 is a variable, it has to be loaded into a register. Generate assembly code to load in3 into register 5.

5. Push in4 on the stack (stack contains in4, in3, reg13). Since in4 is a variable, it has to be loaded into a register. Generate assembly code to load in4 into register 6.

6. '+' is encountered. Pop 2 values off of the stack. Output assembly to perform an add operation between in4 and in3. Put the result in the second register allotted to the equation stack (since in1+in2 is the first element on the stack), which is 14. Push register number 14 onto the stack.

7. '−' is encountered. Pop 2 values off of the stack. Output assembly to perform a subtract operation between register 13 and 14. Put the result in the first register allotted to the equation stack (since there is nothing on the stack), i.e., register 13. Push register number 13 on the stack.

8. Push in5 on the stack (stack contains reg 13). Since in5 is a variable, it has to be loaded into a register. Generate assembly code to load in5 into register 7.

9. '−' is encountered. Pop 2 values off of the stack. Output assembly to perform a subtract operation between register 13 and register 7. Put the result in the first register allotted to the equation stack (since there is nothing on the stack). Push the register number 13 on the stack.

10. The final result is the only element on the stack, i.e., register 13. Generate assembly code writing the contents of register 13 to an output variable.

Equations involving constants are pre-calculated as much as possible. The variable registers 336 are used to load variables into the registers and keep them there through multiple equations. A replacement scheme (such as least recently used) is used to replace variables in registers 336, if there are more variables than registers for them. The replaced variable is moved into memory, since a memory access typically takes less cycles than a transfer out of the processor.

Figure 5:
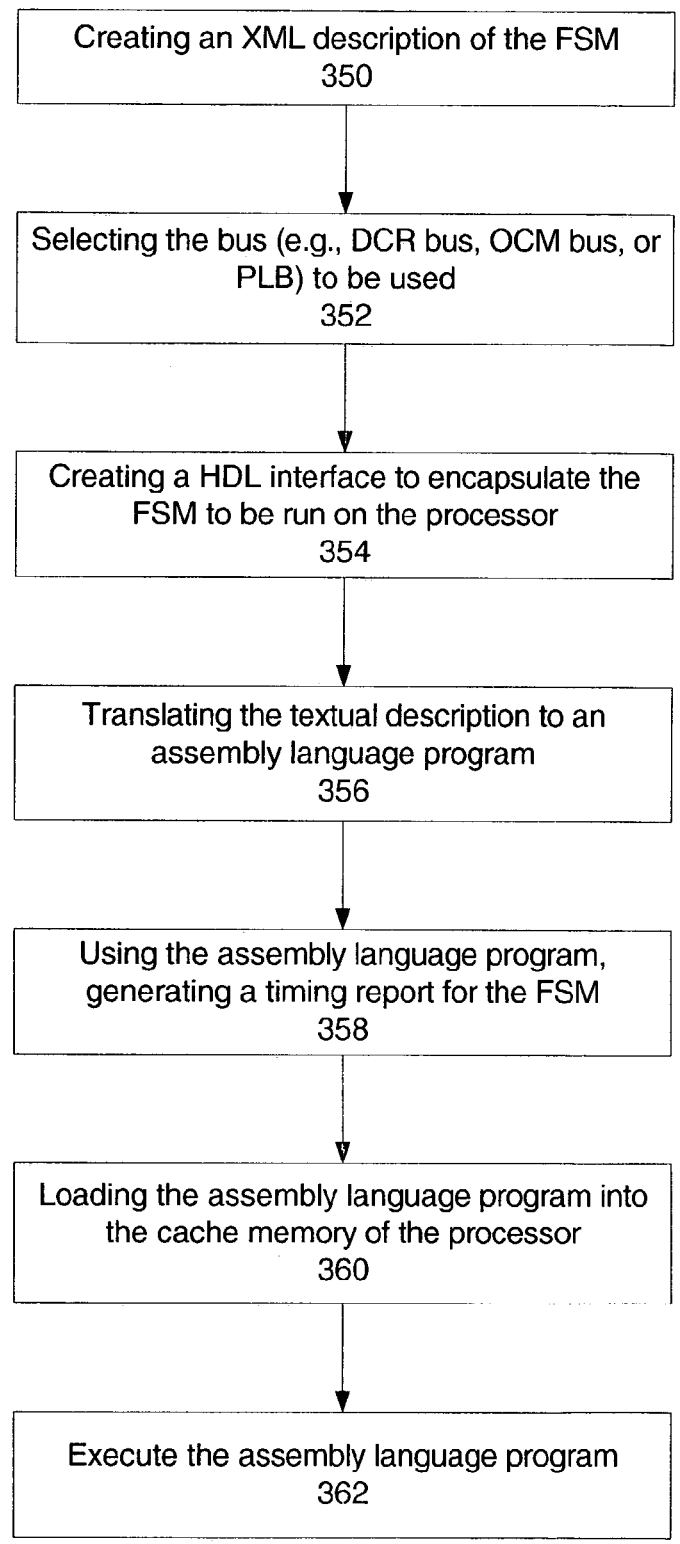
FIG. 5 is a flowchart for generating an FSM of another embodiment of the present invention.

FIG. 5 is a flowchart for generating an FSM of another embodiment of the present invention. The FSM is created on an FPGA such as that shown in FIG. 1. At step 350 an XML description is created of the software FSM. At step 352, one of the buses shown in FIG. 2, i.e., the DCR bus 115, PLB 114, or OCM bus 112, is selected. Next, a HDL interface is created to encapsulate the FSM to be run on the processor core (step 354). The assembly language code is generated from the XML description of the software FSM (step 356). At step 358, the assembly language code is used to create a timing report having timing information for each state of the software FSM, where the timing information is based a count of the processor clock cycles needed to execute each line of the assembly language program. The assembly language program is then assembled and loaded into the cache memory 9 of the processor core 12 (step 360). The assembly language program is then executed by processor core 12 (step 362).

In order to understand in more detail the steps of the flowchart given in FIG. 5 reference is made to an illustrative example FSM (FIG. 6) of a Media Independent Interface (MII) of an Ethernet MAC which runs at 2.5 MHz. This FSM is translated into the assembly code for a PowerPC™ PPC405 processor core from IBM Corporation. The processor runs at a clock speed of about 350 MHz.

Figure 6:
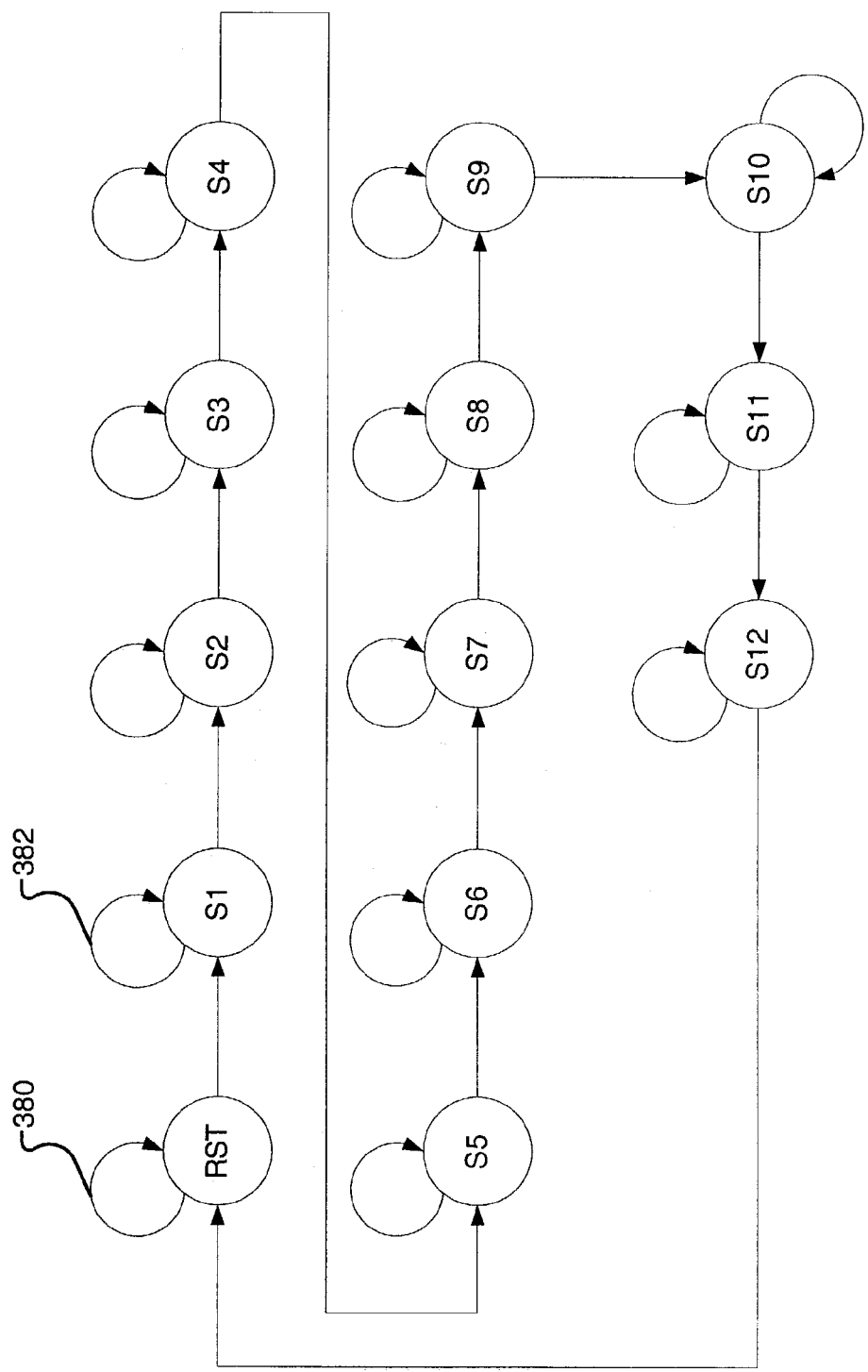
FIG. 6 is a state machine example for a Media Independent Interface (MII)

FIG. 6 is a state machine example for a Media Independent Interface (MII). The VHDL description on which this FSM was based is given in the file miim_manual_vhd.txt in the appendix. The FSM starts in the RST (reset) state and will return to this state from any other state (not shown), if a reset signal is received. Each state has a transition in which the next state is itself, e.g., transitions 380 and 382. This is because every state has a polling loop checking for a rising edge of the FSM clock. The states are consecutive from RST to S1 and so on to S12, where state S12 loops back to state RST. The XML description is given in miim_xml.txt in the Appendix, where state RST in FIG. 6 maps to STATE_RST in the XML file and states S1 to S12 in FIG. 6 maps to states STATE__000000 to STATE__111111 in the XML file.

After the XML description is created (step 350 FIG. 5), a bus, i.e., DCR bus, OCM bus, or PLB, is selected (step 352) at the command line of the program that generates the assembly language code and the HDL interface. In an alternative embodiment, there are, automatically, generated assembly language code and an HDL interface for each of these three buses. A timing report (step 358) is generated for each bus and the three timing reports compared to select the best bus to be used.

Figure 7:
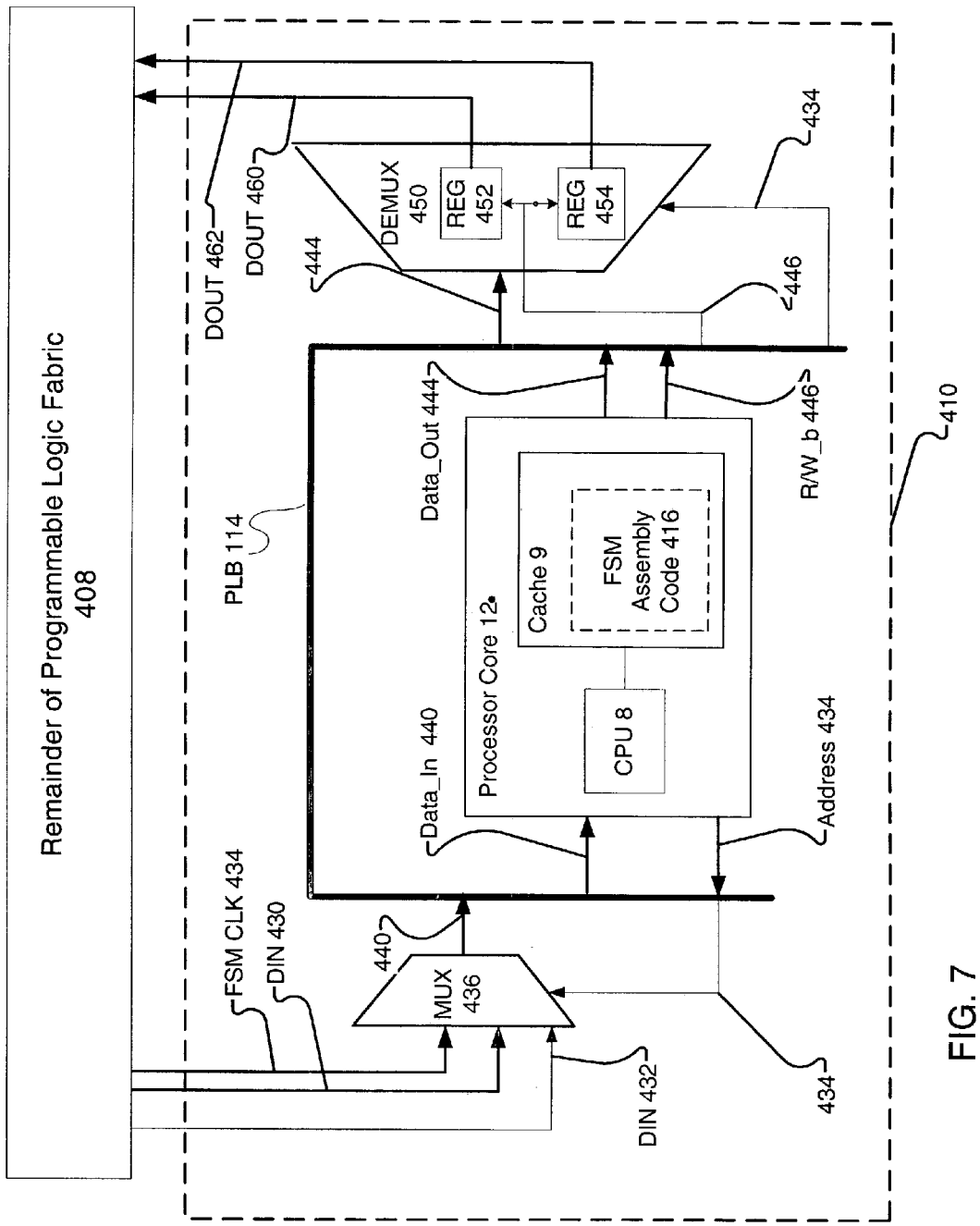
FIG. 7 is a schematic having the interface circuitry of an embodiment of the present invention.

After the XML description is created (step 350 FIG. 5), and the bus selected (step 352), an HDL interface is created (step 354). FIG. 7 is a schematic having the interface circuitry of an embodiment of the present invention. The FSM module 410 represents the software FSM and has data inputs DIN 430, DIN 432, and a state machine clock FSM CLK 434, and data outputs DOUT 460 and DOUT 462. The FSM module 410 includes MUX 436, processor core 12 having the FSM assembly language code 416 stored in cache 9, PLB 114 (assuming the PLB 114 is chosen, rather than the OCM bus or DCR bus), and DEMUX 450 having registers 452 and 454. The FSM module 410 is a black box as far as the remainder of the programmable logic fabric 408 is concerned, hence the processor core 12 is hidden from the hardware components in the programmable logic fabric 408.

Data inputs DIN 430, DIN 432, and FSM CLK 434 are input from the remainder of the programmable logic fabric 408 and are multiplexed by multiplexer (MUX) 436. The select line to MUX 436 comes from the address line 434 output by processor core 12. Since all communication lines into and out of processor core 12 are via PLB 114, in order to simplify the explanation, data lines into and out of PLB which carry the same information are labeled with the same number. For example, the address line 434 out of processor core 12 (which is normally used to address memory) is the select line 434 into MUX 436. The output 440 of MUX 436 is connected to data_in 440, which is input to processor core 12. The data output, i.e., Data_out 444, of processor core 12 is input to de-multiplexer (DEMUX) 450 to produce registered outputs DOUT 460 or DOUT 462, as selected by address line 434. Processor core 12 also outputs a read/write_bar (R/W_b) line 446, which enables registers 452 and 454. When the R/W_b indicates a write to memory then the registers 452 and 454, as selected by address 434, are enabled to latch in the data on line 444. An example VHDL interface, when the DCR bus is selected, is given by file miim_dcr_gpio_vhd.txt in the Appendix.

Figure 8:
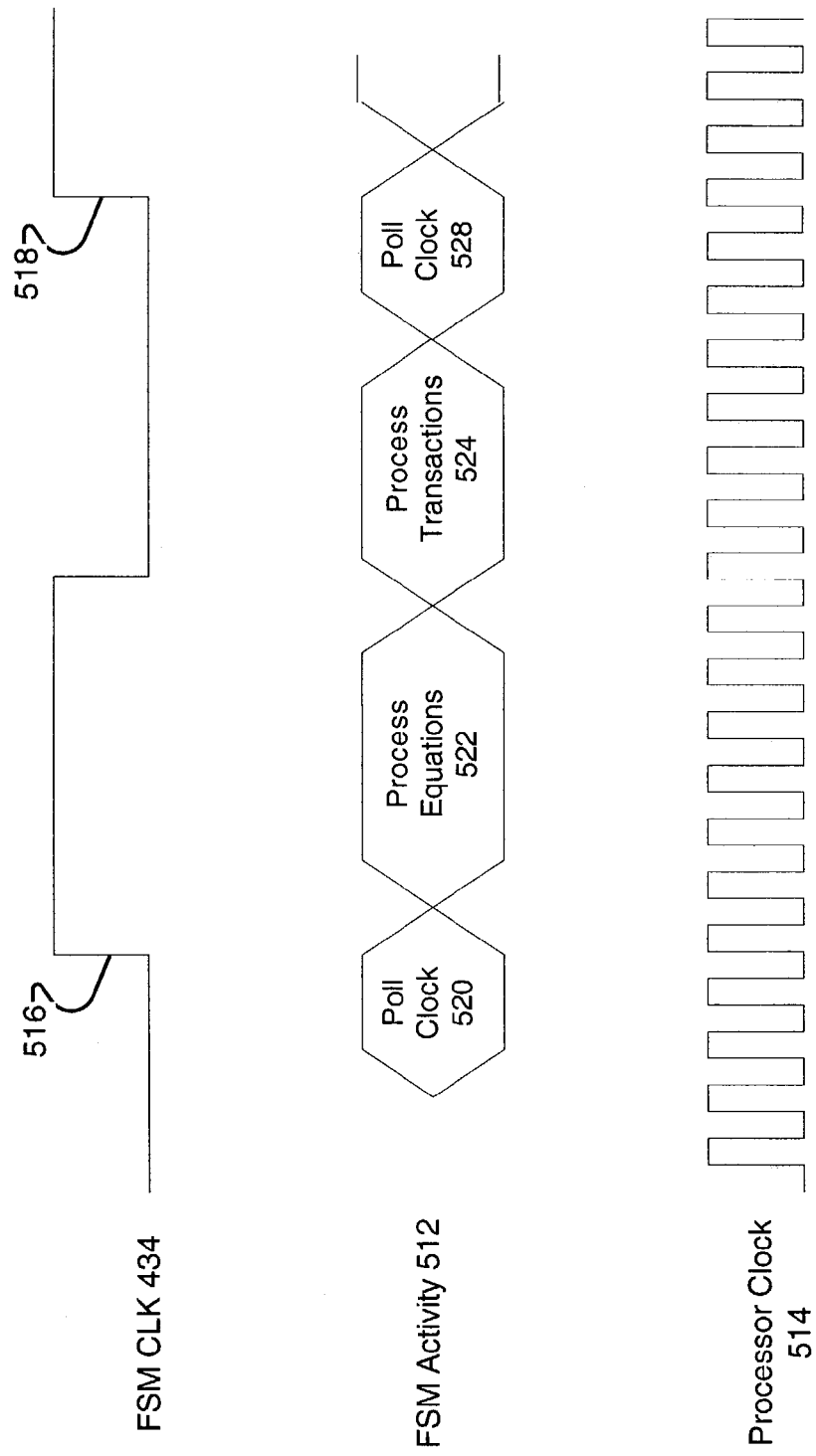
FIG. 8 is a timing diagram for the software FSM of an aspect of the present invention.

FIG. 8 is a timing diagram for the software FSM of an aspect of the present invention. FIG. 8 shows the clock for the finite state machine, i.e., FSM CLK 434. The FSM clock period is determined from the worst-case state, i.e., the state having the longest duration. Although not to scale, the processor core clock 514 is one or more orders of magnitude faster than FSM CLK 434. FSM activity 512 shows the three typical phases that occur in a state of the FSM. The first activity 520 is to poll the FSM CLK 516 until a rising edge 516 is detected. The second activity 522 is to process the equations, including reading data, evaluating the equations and outputting data. The third activity 524 is to process transactions, including evaluating conditions and evaluating equations associated with true conditions. In addition, the process transactions 524 include determining the next state to go to. After transition to the next state, the FSM clock 434 is polled again (poll clock 528) to determine a rising edge 518.

At step 356 the XML description and the selection of the bus is used to translate the XML to assembly language code. FIG. 9 is a commented example of the assembly language code (file commented_miim_dcr.txt of the appendix) that is generated from the XML description for state STATE000001 of file miim_xml.txt in the Appendix. The entire translation for the XML description of the FSM in file miim_xml.txt is given in miim_dcr_asm.txt of the Appendix (assuming that the DCR bus is selected in step 352). When the PLB is selected, the assembly language code generated is given in file miim_plb_asm.txt in the Appendix.

Figure 1:
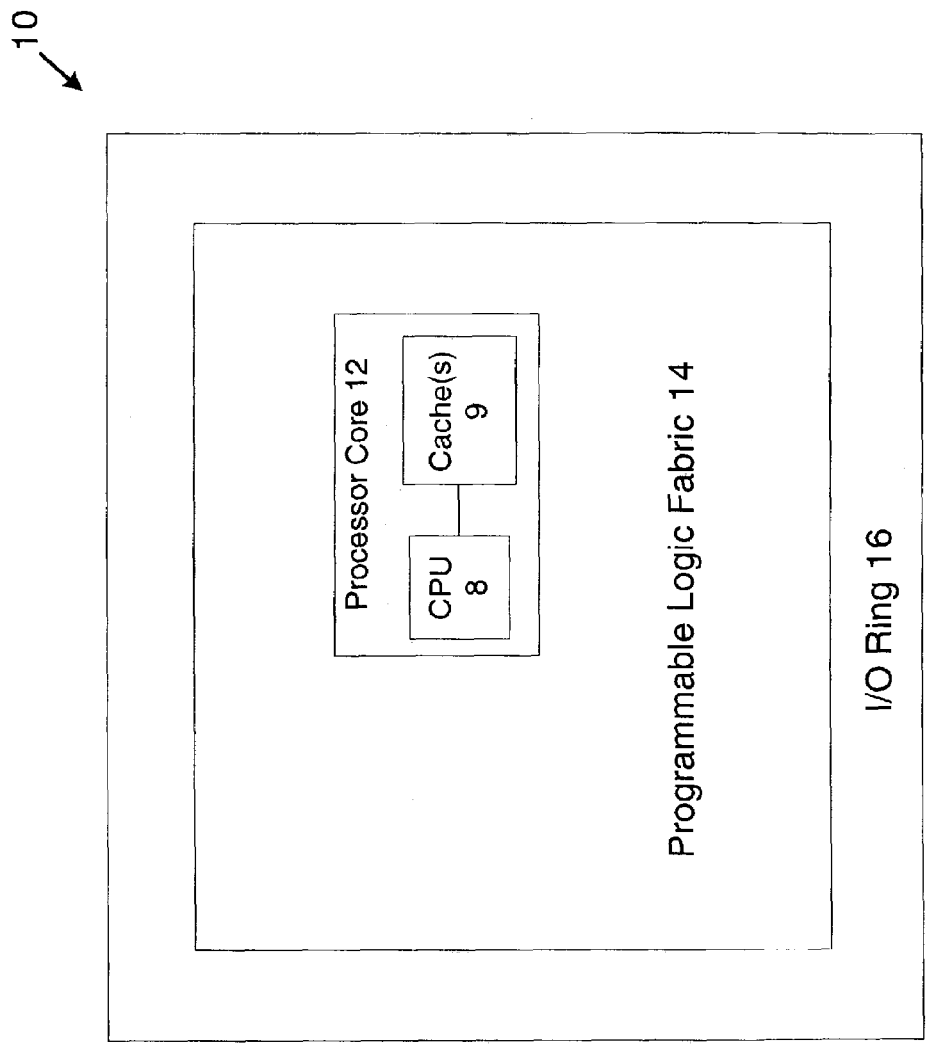
FIG. 1 illustrates a generic diagram of an FPGA having an embedded processor core of the prior art.

From the comments of FIG. 9 each assembly language instruction is associated with an integer number of processor, i.e., CPU 8 of FIG. 1, clock cycles. By accumulating the clock cycles in a state a timing report, such as shown in FIG. 10 and in file report_miim_dcr.txt (or file report_miim_plb.txt) in the Appendix, is generated (step 358).

FIG. 10 is an example timing report of an aspect of the present invention. The selected bus is the DCR bus and the processor clock is about 350 MHz (2.857143 ns period). Looking at STATE__000001 540, a clock branch has 18 processor cycles including 9 cycles [I/O] to load the current FSM clock (FSM CLK) value from the DCR. The clock branch is part of the polling of the FSM clock (poll clock 520 of FIG. 8) and indicates after 18 clocks the state has branched back to the beginning to poll the FSM clock again. The not branch of 16 cycles, including 9 cycles [I/O] to load the current FSM clock (FSM CLK) value from the DCR, indicates that a rising edge of the FSM was detected and the next FSM activity, process equations 522 is to be done. The next three items: "RESET to STATE_RST: 29 cycles," "to STATE__100000: 59 cycles," and "to STATE__000001: 58 cycles," give the cumulative number of cycles from the start of state STATE__000001 to the beginning of the next state.

Figure 11:
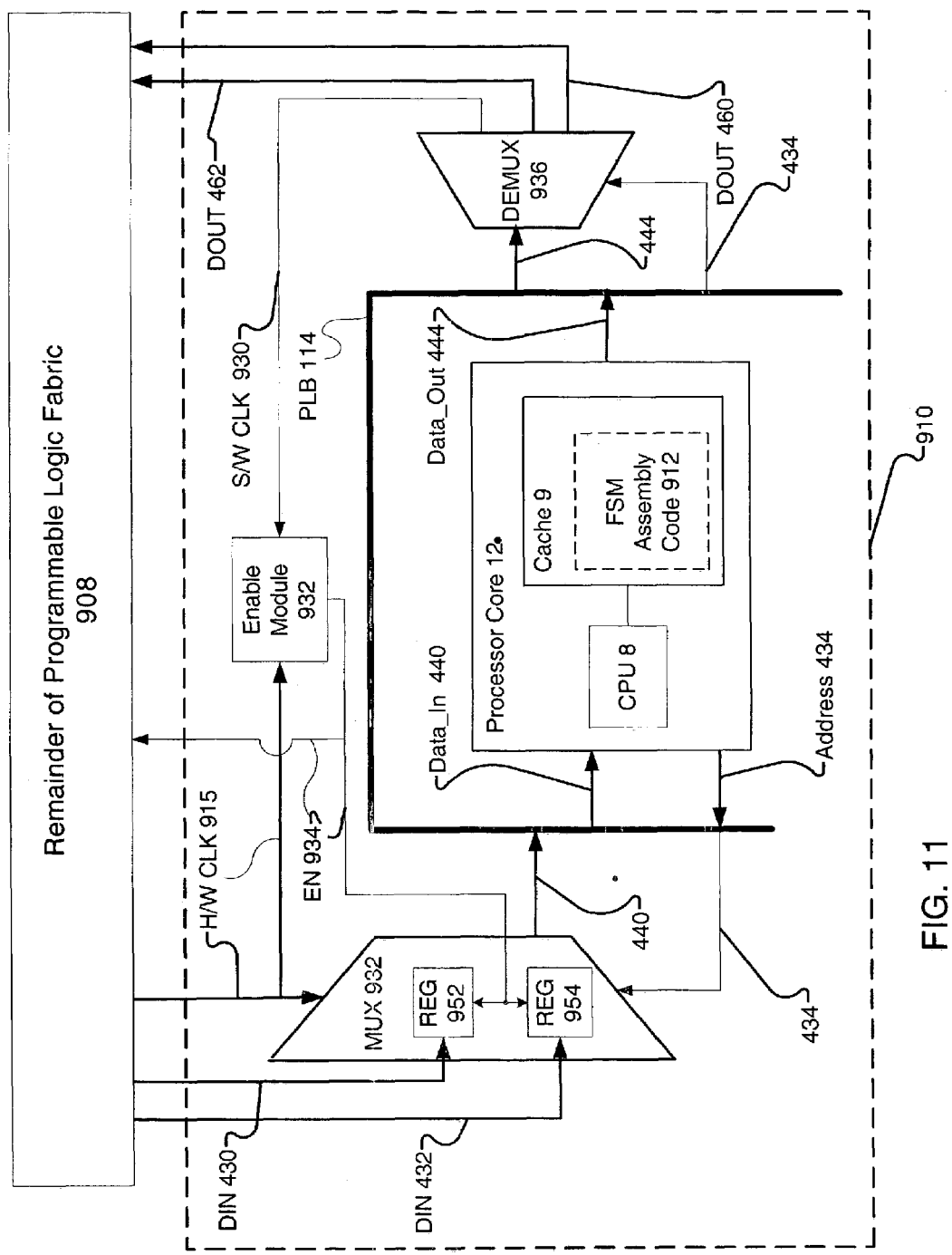
FIG. 11 is a schematic having the interface circuitry of an alternative embodiment of the present invention.

In another embodiment of the present invention a global hardware clock of the programmable logic fabric 14, i.e., H/W CLK 915, is input to the FSM module 910 rather that the FSM CLK 434, as shown in FIG. 11. The data inputs DIN 430 and DIN 432 and data outputs DOUT 460 and DOUT 462 are the same as in FSM module 410 of FIG. 7. An additional data valid output signal, i.e., enable (EN) 934, from FSM module 910 indicates to the remainder of the programmable logic fabric 908, when the input data (DIN 430 and DIN 432) will be registered in multiplexer (MUX) 932 via registers REG 952 and REG 954 and when the output data (DOUT 460 and DOUT 462) is valid from de-multiplexer 436. Since FIG. 11 has certain similarities to FIG. 7, where the elements are the same, the same label is used.

FIG. 11 is a schematic having the interface circuitry of an alternative embodiment of the present invention. The FSM module 910 includes MUX 932 having registers 952 and 954, processor core 12 having the FSM assembly language code 912 stored in cache 9, PLB 114 (assuming the PLB 114 is chosen, rather than the OCM bus or DCR bus), Enable Module 932, and DEMUX 936. The FSM module 910 is a black box as far as the remainder of the programmable logic fabric 908 is concerned, hence the processor core 12 is hidden from the hardware components in the programmable logic fabric 908.

Data inputs DIN 430, DIN 432, and H/W CLK 915 are input from the remainder of the programmable logic fabric 908 into multiplexer (MUX) 932. DIN 430 and DIN 432 go to registers REG 952 and 954, respectively. REG 952 and 954 are clocked by H/W CLK 915 and are enabled by an enable signal EN 934 from enable module 932. The select line to MUX 932 comes from the address line 434 output by processor core 12. The output 440 of MUX 932 is connected to Data_in 440, which is input to processor core 12. The data output, i.e., Data_out 444, of processor core 12 is input to de-multiplexer (DEMUX) 936 to produce registered outputs S/W CLK 930, DOUT 460 or DOUT 462, as selected by address line 434. S/W CLK 930 is actually a series of pulses, which may or may not occur at regular intervals. The leading edge of a first pulse indicates the start of the first state and the leading edge of the second or next pulse indicates the start of the second or next state. As the duration of time from the beginning of one state to another state typically varies, the S/W CLK has typically different times between pulses.

Figure 12:
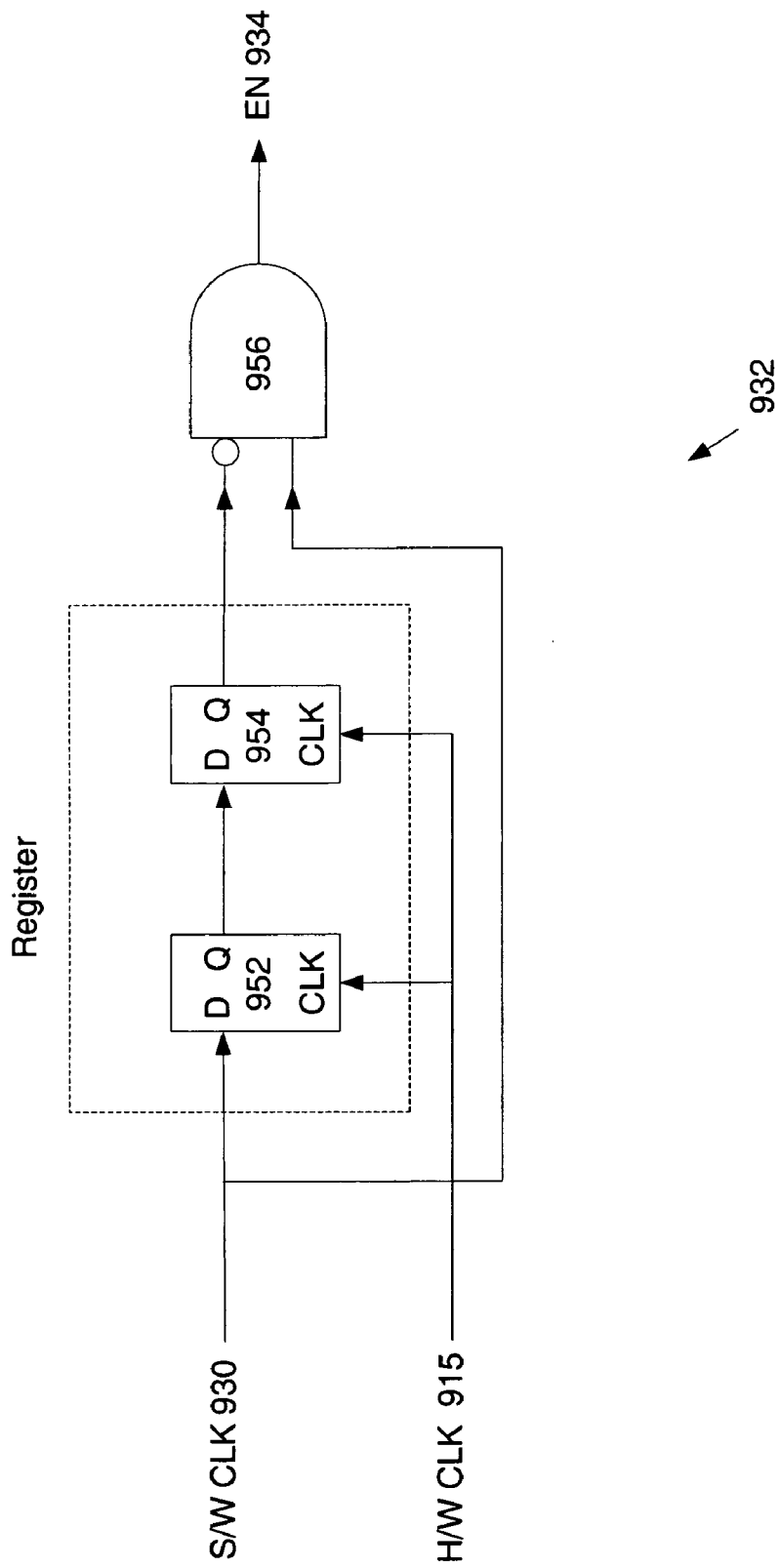
FIG. 12 is a schematic of an enable module of an embodiment of the present invention.

FIG. 12 is a schematic of an enable module 932 of an embodiment of the present invention. Enable module 932 includes the D flip-flops 952 and 954 connected in series, and AND gate 956 which produces output EN 934. D flip-flops 952 and 954 are clocked by H/W CLK 915. D flip-flop 952 receives S/W CLK 930 as its D input. D flip-flop 952 is connected to D flip-flop 954. AND gate 956 receives S/W CLK 930 and the inversion of output Q from D flip-flop 954.

Figure 13:
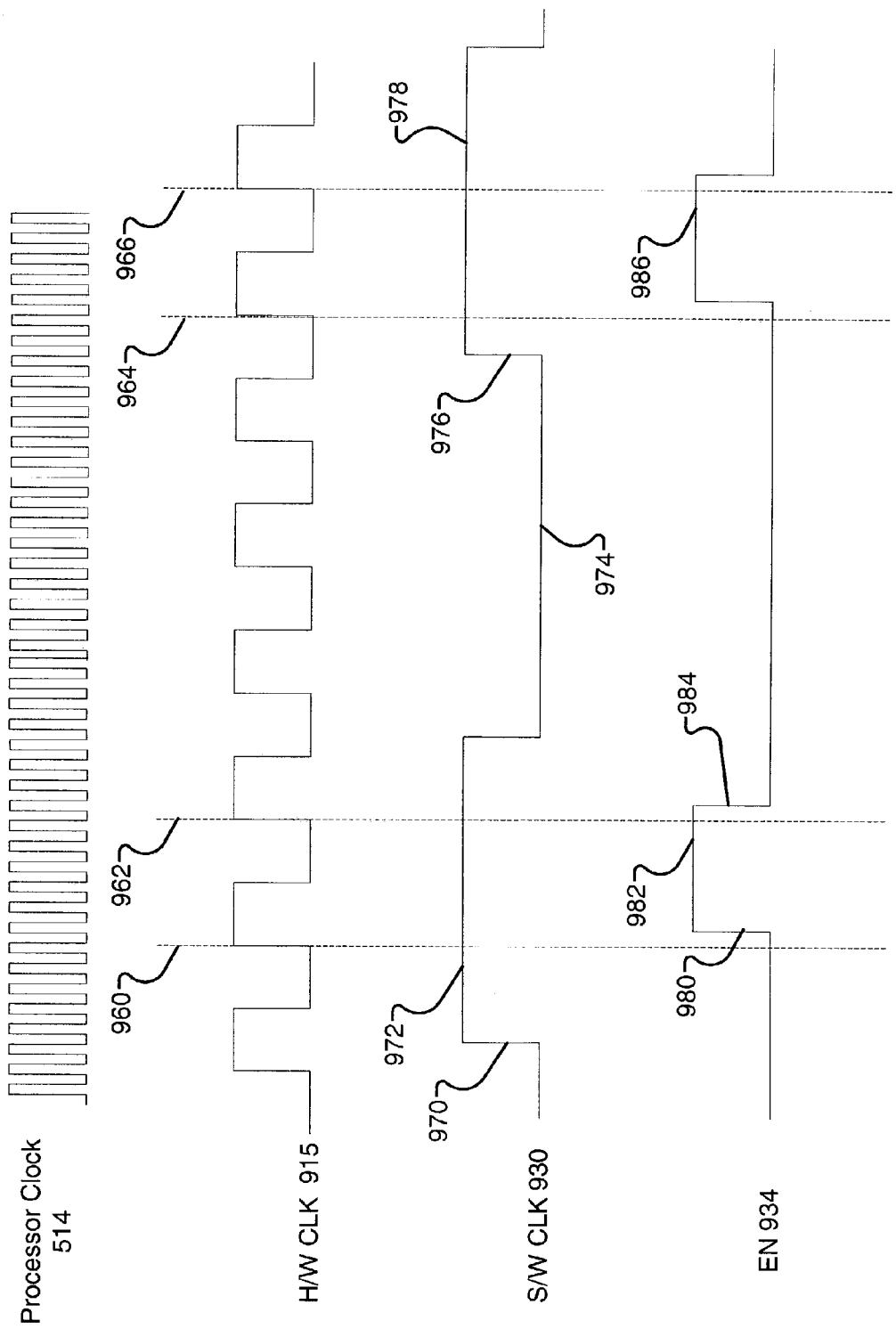
FIG. 13 is a timing diagram showing the inputs and the output for enable module of FIG. 12.

FIG. 13 is a timing diagram showing the inputs (S/W CLK 930 and H/W CLK 915) and the output (EN 934) for enable module 932 of FIG. 12. Two clock periods for H/W clock 915 are shown between lines 960 and 962 and between lines 964 and 966, where the lines represent rising edges of H/W clock 915. The S/W clock 930 having rising edge 970 is coincident with a rising edge of processor clock 514 and indicates the start of the first state. Processor clock 514 (not to scale) is typically much faster than H/W clock 915. S/W clock 930 remains high (pulse 972) for the number of cycles required to write data on the bus. The S/W clock 930 then goes low 974 indicating that the transition conditions and equations are being evaluated. At the next rising edge 976, the second or next state begins and the next state pulse 978 is then created. The enable pulse 982 for the enable line 934 is generated using the S/W CLK pulse 972 and the H/W CLK 915 between lines 960 and 962. From FIG. 12, when S/W clock 930 goes to 1 (rising edge 970), flip-flop 952 outputs a 1 at the first rising edge of H/W clock 915, as indicated by line 960. The output of flip-flop 954 is 0, and hence the output of AND gate 956 is 1 after a delay as indicated by enable line 934 going to 1 (rising edge 980). At the next rising edge of hardware clock 915 as indicated by line 962, flip-flop 954 has input 1 and therefore outputs a 1, hence AND gate 956 outputs a 0. Thus enable line 934 goes from 1 to 0 after a delay (falling edge 984). Similarly, pulse 986 is produced on EN line 934, when S/W clock 930 goes high 976 (and pulse 978), and there are consecutive rising edges on H/W clock 915 as indicated by lines 964 and 966.

Although the above functionality has generally been described in terms of specific hardware and software, it would be recognized that the invention has a much broader range of applicability. For example, the software functionality can be further combined or even separated. Similarly, the hardware functionality can be further combined, or even separated. The software functionality can be implemented in terms of hardware or a combination of hardware and software. Similarly, the hardware functionality can be implemented in software or a combination of hardware and software.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps.

The invention claimed is:

1. A method for implementing a finite state machine (FSM) using a processor, comprising:
    obtaining a graphical or textual description of a plurality of states of the FSM wherein the textual description is written in an eXtensible Mark-up Language (XML);
    generating a plurality of instructions in assembly language for a state of the plurality of states from the graphical or textual description, the plurality of instructions stored in a computer readable medium accessible by the processor, wherein each instruction of the plurality of instructions has a pre-determined number of processor clock cycles associated with that instruction; and
    before execution of the plurality of instructions on the processor, generating timing information for the state based on an accumulation of the pre-determined number of processor clock cycles associated with each instruction of the plurality of instructions.

2. The method of claim 1, wherein the computer readable medium comprises a cache memory coupled to the processor.

3. The method of claim 1 further comprising, creating a HDL interface to the processor for encapsulating the processor.

4. The method of claim 1 further comprising, selecting a bus from a group consisting of a PLB a OCM bus, and a DCR bus, wherein the selected bus is used in generating the plurality of instructions.

5. A system for generating a finite state machine (FSM) or part thereof for use by a processor embedded in an integrated circuit having a programmable logic fabric, the system comprising:
    a textual description of the FSM or part thereof, wherein the textual description is written in an eXtensible Mark-up Language (XML);
    translation program stored in a computer readable medium, configured to convert the textual description to a plurality of assembly language instructions;
    a cache memory coupled to the processor, the cache memory for storing the plurality of assembly language instructions;
    a predetermined number of processor clock cycles associated with an assembly language instruction of the plurality of assembly language instructions; and
    a timing output comprising an indication of a duration of time in a state of the FSM, the state comprising the assembly language instruction, and wherein the indication is derived at least in part from the predetermined number of processor clock cycle.

6. The system of claim 5 further comprising, an interface for hiding the implementation of the FSM or part thereof on the processor from the programmable logic fabric, the interface configured to convert inputs to the FSM or part thereof into data bus inputs into the processor and data bus outputs of the processor to outputs of the FSM or part thereof.

7. The system of claim 6 wherein the interface comprises:
a multiplexer for receiving the inputs to the FSM or part thereof, the multiplexer having an address line of the processor as a control input;
a bus coupled to the multiplexer and the processor; and
a demultiplexer coupled to the bus for transmitting outputs of the FSM or part thereof, the demultiplexer comprising at least one register for receiving data bus outputs of the processor.

8. The system of claim 7 wherein the at least one register has a read/write control input for enabling the at least one register, the read/write control input produced by the processor.

9. The system of claim 6 wherein the interface comprises:
an enable module comprising a register and an AND gate, for producing an enable signal;
a multiplexer for receiving the inputs to the FSM or part thereof, the multiplexer comprising an address line of the processor as a control input and at least one register for receiving inputs to the FSM, the at least one register enabled by the enable signal;
a bus coupled to the multiplexer and the processor; and
a demultiplexer coupled to the bus for transmitting outputs of the FSM or part thereof, the demultiplexer comprising an address line of the processor as a control input.

10. The system of claim 6 wherein the inputs to the FSM comprise data inputs and a hardware clock.

11. The system of claim 6 wherein the interface comprises Hardware Description Language code.

12. The system of claim 7 wherein the bus is selected from a group consisting of a PLB, an OCM bus, and a DCR bus.

13. The system of claim 7 wherein the inputs to the FSM comprise data inputs and an FSM clock.

14. A system for generating timing information for a finite state machine (FSM) or part thereof executed by a processor, the system comprising:
a plurality of instructions stored in a computer readable medium, wherein the plurality of instructions define at least part of a state of the FSM or part thereof; wherein the plurality of instructions comprise: assembly language instructions or machine language instructions; wherein the plurality of instructions are converted from a textual description; wherein the textual description is written in an eXtensible Mark-up Language (XML);
a count of processor clock cycles associated with an instruction of the plurality of instructions, the count determined before the instruction is executed; and
timing information for the state comprising a total count of processor clock cycles associated with the plurality of instructions.

15. The system of claim 14 further comprising a cache memory coupled to the processor, wherein the computer readable medium comprises the cache memory.

16. The system of claim 14 wherein the plurality of instructions comprise equations and transitions.

17. The system of claim 16 wherein the transitions comprise equations and transition conditions.

18. A system for generating a finite state machine (FSM) or part thereof for use by a processor embedded in an integrated circuit having a programmable logic fabric, the system comprising:
means for generating a textual description of the FSM;
means for generating the assembly language code from the textual description wherein the textual description is written in an eXtensible Mark-up Language (XML);
means for interfacing the processor with the programmable logic fabric;
means for storing the assembly language code;
means for producing a count of processor clock cycles associated with an instruction of the assembly language code; and
means for generating a timing report having timing information for a state of the FSM, the timing information based at least in part on the count.

* * * * *